US006903997B2

(12) United States Patent
Mimura

(10) Patent No.: US 6,903,997 B2
(45) Date of Patent: Jun. 7, 2005

(54) OPERATION VERIFICATION SYSTEM AND ADAPTIVE CONTROL SYSTEM

(75) Inventor: Nobuhiro Mimura, Kadoma (JP)

(73) Assignee: Matsushita Electric Industrial Co., Ltd. (JP)

( * ) Notice: Subject to any disclaimer, the term of this patent is extended or adjusted under 35 U.S.C. 154(b) by 95 days.

(21) Appl. No.: 10/300,014

(22) Filed: Nov. 20, 2002

(65) Prior Publication Data

US 2003/0117853 A1 Jun. 26, 2003

(30) Foreign Application Priority Data

Nov. 20, 2001 (JP) ........................................ 2001-353939

(51) Int. Cl.[7] ................................................. G11C 8/00
(52) U.S. Cl. ............. 365/233; 365/189.05; 365/189.07; 365/194
(58) Field of Search ........................... 365/233, 189.05, 365/189.07, 194

(56) References Cited

U.S. PATENT DOCUMENTS 4,419,737 A * 12/1983 Yamaura et al. ............ 713/500
5,748,782 A * 5/1998 Ferreira et al. ............. 382/232
5,969,996 A    10/1999 Muranaka et al. ...... 365/189.01

FOREIGN PATENT DOCUMENTS

JP           05264667 A       10/1993

* cited by examiner

Primary Examiner—Son T. Dinh
(74) Attorney, Agent, or Firm—Parkhurst & Wendel, L.L.P.

(57) ABSTRACT

The invention provides an operation verification system that can verify a stable operation at the device mounting, and an adaptive control system that can speed up the arithmetic up to its internal stable operation limit and reduce loads on a control circuit within an internal stable operation range. An operation verification system includes a normal operation circuit 104 that is constituted by a clock generation unit 101 for generating an operation clock, a first memory element 102 as an operation verification target, and an arithmetic circuit group 103; and an operation verification circuit 107 that is constituted by a second memory element 150 that stores the same data as stored in the first memory element 102, with a clock having a different phase, and a judgement unit 106 for judging whether the circuit 104 is stably operating or not, on the basis of outputs from the first and second memory elements 102 and 105, and monitors an output from the judgement unit 106, to perform verification of high-speed operation of the first memory element 102 at a low operation frequency.

22 Claims, 12 Drawing Sheets

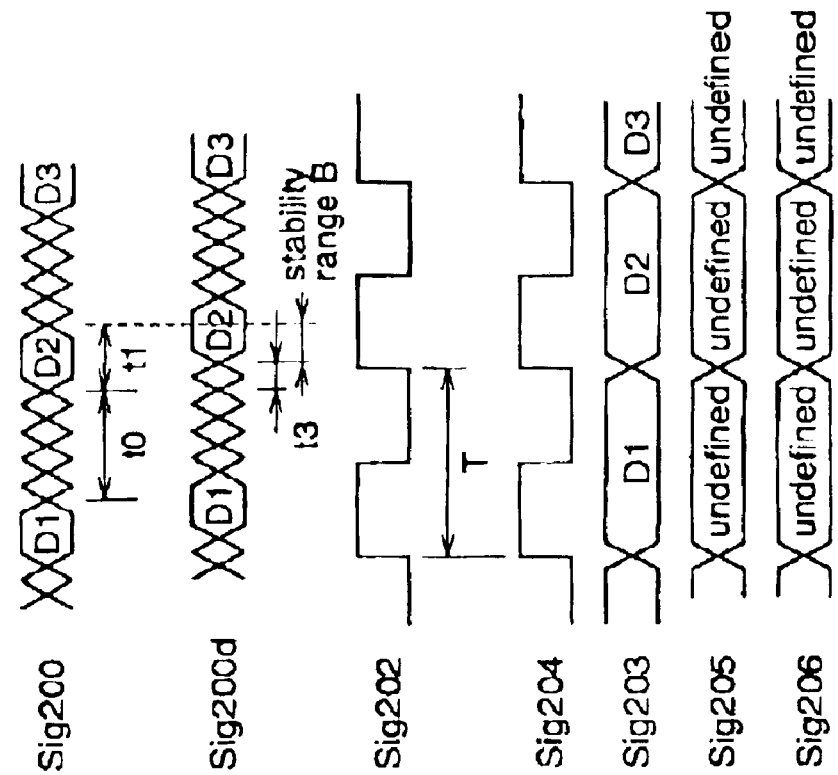
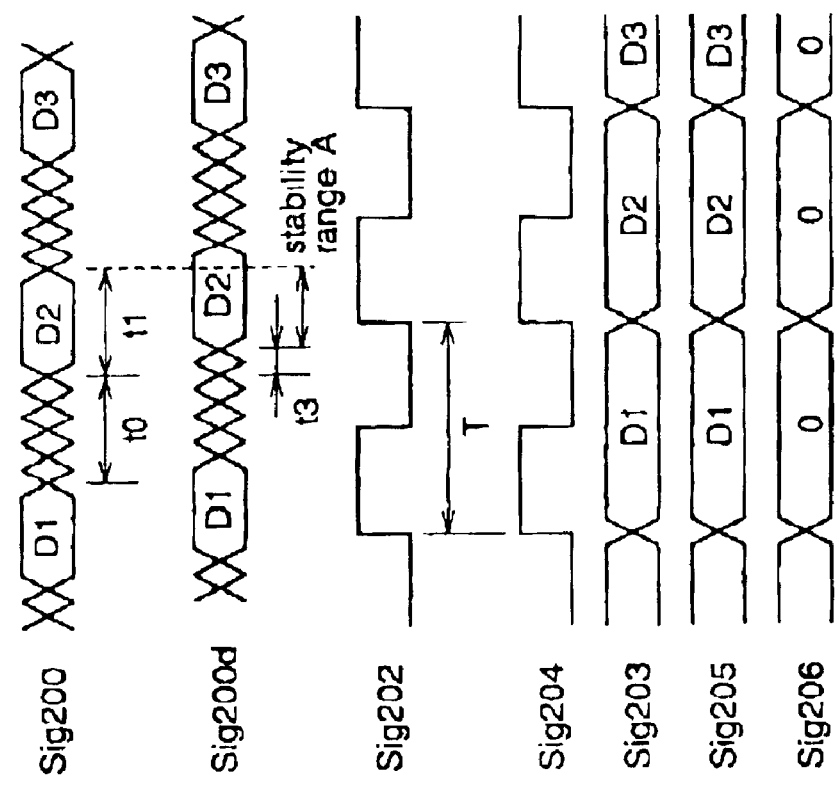

OPERATION VERIFICATION SYSTEM AND ADAPTIVE CONTROL SYSTEM

FIELD OF THE INVENTION

The present invention relates to an operation verification system and an adaptive control system in a semiconductor integrated circuit and, more particularly, to an operation verification system and an adaptive control system that optimize control for arithmetic circuit operation environments and reduce loads on control circuits.

BACKGROUND OF THE INVENTION

In recent years, semiconductor integrated circuits are increasingly made more miniscule, and a mechanism for stabilizing an internal operation and a control mechanism for unleashing the full power of the real circuit are demanded in designing semiconductor integrated circuits. To ensure a high-speed operation of a semiconductor integrated circuit, the internal operation frequency is increased to perform an inspection at the shipment of the semiconductor integrated circuit. Further, to assure its operation as a product, an upper limit of the operation frequency of the semiconductor integrated circuit is decided with an operation frequency at which the circuit can operate under the worst conditions, at the shipment of the semiconductor integrated circuit. (Refer to Japanese Published Patent Application No. Hei. 05-264667.)

The conventional operation verification system, however, has following problems.

Since the operation frequency needs to be increased to perform verification of a high-speed operation, it can be supposed to mount a high-performance tester that can input a high-speed clock for the verification. However, it is difficult in practice to mount such a tester to verify a high-speed operation from the point of view of circuit scale or costs.

Further, as for stable operation assurance such as that at the high-speed operation, that with respect to supply voltage and that with respect to peripheral temperature, verification is needed assuming all possible conditions in the verification at the shipment of semiconductor integrated circuits, because the stable operation verification is not performed at the mounting of the real device. Consequently, even when the mounted semiconductor integrated circuit has enough arithmetic ability, only a minimum level of assurance is obtained. In addition, as the stable operation assurance cannot be verified at the mounting, there is no criteria for making judgements for relaxation of a frequency control accuracy, reduction of the power voltage, relaxation of a temperature control setting target and a temperature control accuracy and the like, within ranges in which the internal operation circuit stably works. Accordingly, respective control circuits operate at capabilities that are higher than their optimal minimum capabilities.

SUMMARY OF THE INVENTION

The present invention has for its object to provide an operation verification system that can verify a stable operation at the mounting of a device. Another object of the present invention is to provide an adaptive control system that can speed up arithmetic, up to an internal stable operation limit, as well as can reduce loads on control circuits within an internal stable operation range.

Other objects and advantages of the invention will become apparent from the detailed description that follows.

The detailed description and specific embodiments described are provided only for illustration since various additions and modifications within the spirit and scope of the invention will be apparent to those of skill in the art from the detailed description.

According to a 1st aspect of the present invention, there is provided an operation verification system including: a normal operation circuit that is constituted by a clock generation unit for generating a clock for an internal operation, a first memory element as a target of operation verification, and an arithmetic circuit group which comprises arithmetic circuits other than the first memory element; and an operation verification circuit that is constituted by a second memory element that stores same data which is stored in the first memory element, in accordance with a clock having a different phase from that of the first memory element, and a judgement unit for judging whether the normal operation circuit is operating stably or not on the basis of results outputted from the first and second memory elements, and this operation verification system monitors an output from the judgement unit, to perform verification of a high-speed operation of the first memory element, at a low operation frequency. Therefore, the verification of the high-speed operation can be performed at a lower frequency, and further a real-time verification of the high-speed operation can be performed on the mounted real device.

According to a 2nd aspect of the present invention, there is provided an operation verification system including: a normal operation circuit that is constituted by a clock generation unit for generating a clock for an internal operation, a first memory element as a target of operation verification, and an arithmetic circuit group which comprises arithmetic circuits other than the first memory element; and an operation verification circuit that is constituted by a delay circuit for delaying data outputted from the arithmetic circuit group, which is to be latched by the first memory element, a second memory element that stores data delayed by the delay circuit, in accordance with a clock having a same phase as that of the first memory element, and a judgement unit for judging whether the normal operation circuit is operating stably or not on the basis of results outputted from the first and second memory elements, and this operation verification system monitors an output from the judgement unit, to perform verification of a high-speed operation of the first memory element, at a low operation frequency. Therefore, the verification of the high-speed operation can be performed at a lower frequency, and a real-time verification of the high-speed operation can be performed on the mounted real device.

According to a 3rd aspect of the present invention, there is provided an operation verification system including: a normal operation circuit that is constituted by a clock generation unit for generating a clock for an internal operation, a first memory element as a target of operation verification, and an arithmetic circuit group which comprises arithmetic circuits other than the first memory element; and an operation verification circuit that is constituted by a delay circuit for delaying data outputted from the arithmetic circuit group, which is to be latched by the first memory element, a second memory element that stores data delayed by the delay circuit, in accordance with a clock having a different phase from that of the first memory element, and a judgement unit for judging whether the normal operation circuit is operating stably or not on the basis of results outputted from the first and second memory elements, and this operation verification system monitors an output from the judgement unit, to perform verification of a high-speed operation of the first memory element, at a low operation frequency. Therefore, the verification of the high-speed operation can be performed at a lower frequency, and a real-time verification of the high-speed operation can be performed on the mounted real device.

According to a 4th aspect of the present invention, there is provided an adaptive control system having the operation verification system of the present invention including: a factor control circuit for controlling a factor as an element that changes an internal arithmetic time in the normal operation circuit, on the basis of the output from the judgement unit, in which the output of the judgement unit is monitored to perform the verification of a high-speed operation of the first memory element at a low operation frequency, while feeding back a result of the verification to the factor control circuit to control the factor within a range in which the factor can be controlled, to reduce the internal arithmetic time as well as enlarge a range in which the normal operation circuit is judged to be able to operate stably on the basis of the result outputted from the judgement unit. Therefore, the arithmetic time can be shortened while considering a stable operation of the normal operation circuit, thereby enlarging a range in which the normal operation circuit can stably operate.

According to a 5th aspect of the present invention, there is provided an adaptive control system having the operation verification system of the present invention including: a factor control circuit for controlling a factor as an element that changes an internal arithmetic time in the normal operation circuit on the basis of a result outputted from the judgement unit, in which the factor control circuit performs control for reducing power consumption by the adaptive control system within a range in which the normal operation circuit is judged to be able to operate stably on the basis of the output result from the judgement unit. Therefore, the power consumption can be reduced within a range in which the normal operation circuit can stably operate.

BRIEF DESCRIPTION OF THE DRAWINGS

FIG. 2(a) shows a case where there is an operation margin, and FIG. 2(b) shows a case where there is no operation margin.

FIGS. 4(a) and 4(b) are timing charts for explaining the operation verification system according to the second embodiment. FIG. 4(a) shows a case where there is an operation margin, and FIG. 4(b) shows a case where there is no operation margin.

FIG. 6(a) is a flowchart for explaining an operation of the adaptive control system for speeding up an internal operation, and FIG. 6(b) is a flowchart for explaining an operation of the adaptive control system for reducing power consumption.

DETAILED DESCRIPTION OF THE PREFERRED EMBODIMENTS

[Embodiment 1]

Figure 1:
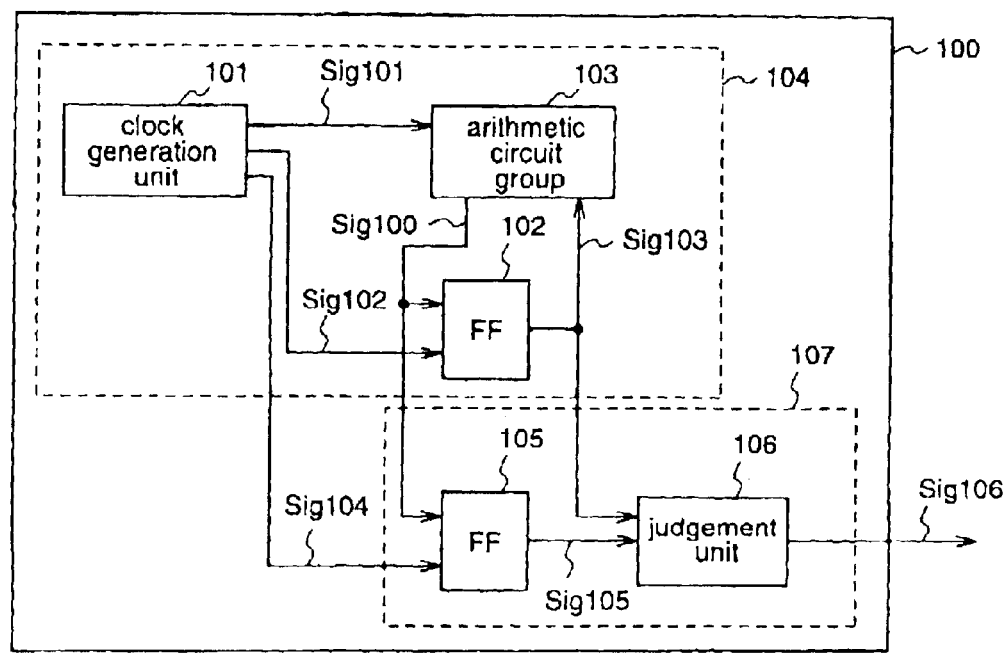
FIG. 1 is a block diagram illustrating a construction of an operation verification system according to a first embodiment of the present invention.

FIG. 1 is a block diagram illustrating a construction of an operation verification system according to a first embodiment of the present invention.

In FIG. 1, this operation verification system 100 is constituted by a normal operation circuit 104 for implementing an original function of a semiconductor integrated circuit, and an operation verification circuit 107 for verifying whether a flipflop (hereinafter, abbreviated to FF) 102 that is a target for the verification is stably operating or not.

The normal operation circuit 104 is constituted by a clock generation unit 101 for generating a clock for an internal operation, a FF 102 that is a first memory element as a target for the operation verification, and an arithmetic circuit group 103 that comprises arithmetic circuits other than the FF 102 as the verification target. The operation verification circuit 107 is constituted by a FF 105 as a second memory element that stores data in a different timing from the FF 102, and a judgement unit 106 for judging whether the normal operation circuit 104 is stably operating or not.

Here, the FF 102 selected as an inspection target (operation verification target) is a FF that is temporally critical in timing as a result of a delay simulation in which capacitor and resistor components are reflected at a stage of semiconductor integrated circuit design.

Next, respective signals in FIG. 1 will be described.

Sig100 is a signal outputted from the arithmetic circuit group 103, which is latched by the FF 102 and the FF 105. Sig101 is a clock for driving circuits in the arithmetic circuit group 103. Sig102 is a clock for making the FF 102 perform latching. Sig103 is an output from the FF 102 and inputted to the arithmetic circuit group 103 and the judgement unit 106. Sig104 is a clock for making the FF 105 perform latching, and this clock is preceding in phase with relative to the clock Sig102. Sig105 is an output from the FF 105. Sig106 is a result of judgement as to a comparison between the output signal Sig103 from the FF 102 and the output signal Sig105 from the FF 105.

Then, an operation of the operation verification system that is constructed as described above will be described.

Figure 2A:
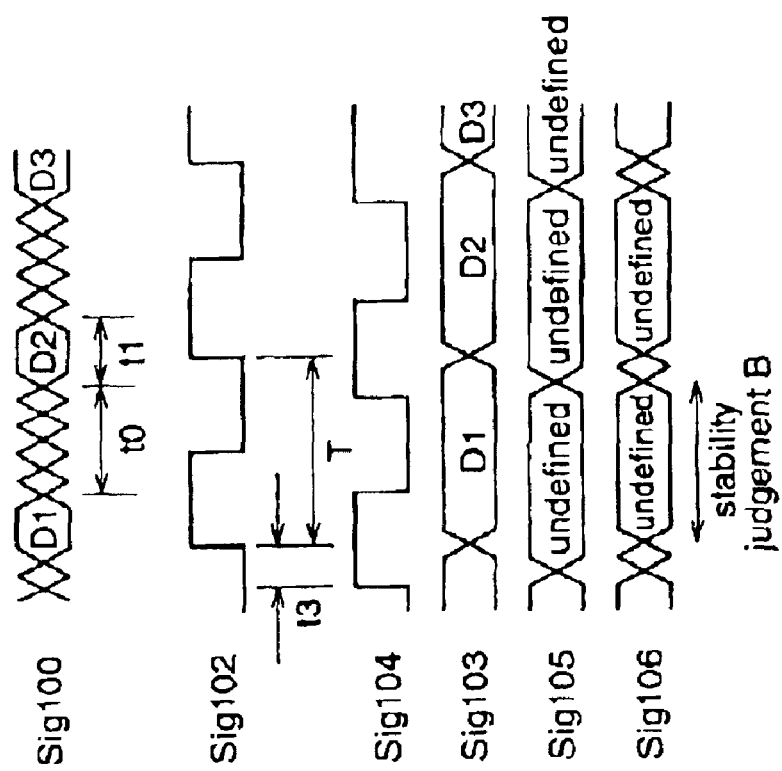
FIGS. 2(a) and 2(b) are timing charts for explaining the operation verification system according to the first embodiment.
Figure 2B:
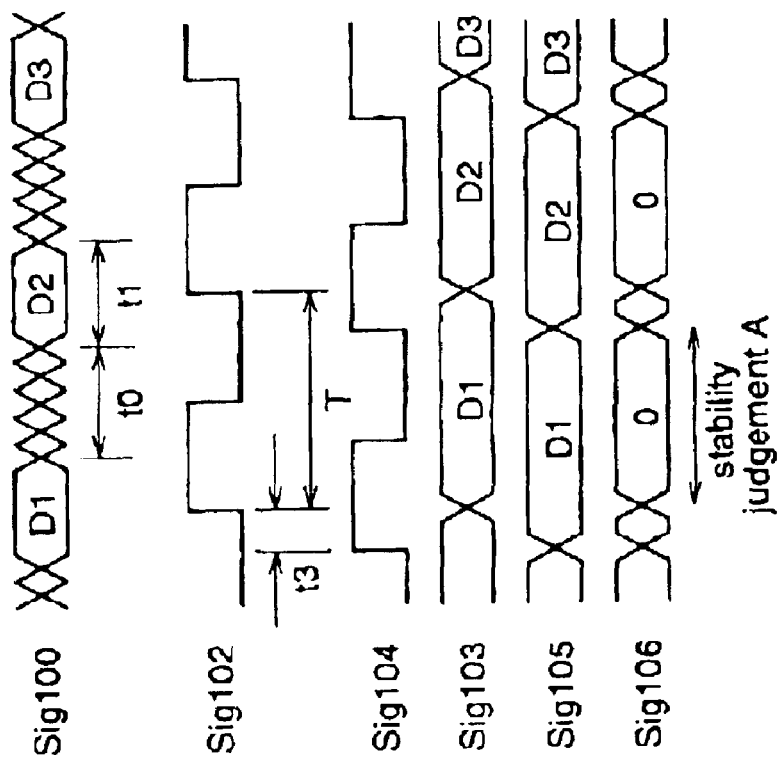

FIGS. 2(a) and 2(b) are timing charts for explaining operation verification judgements in the operation verification system according to the first embodiment.

Reference t0 denotes an arithmetic time that is required until data corresponding to Sig100 is determined, and this arithmetic time t0 is fixed regardless of the operation frequency. Reference t1 denotes a time during which the data corresponding to Sig100 is being determined, and this time t1 varies with the operation frequency; Reference t3 denotes a relative phase difference between the clock Sig102 and the clock Sig104. "T" denotes a clock cycle of the clock Sig102, and the cycle T depends on the inverse of the operation frequency. As the latch timing of the FF 105 is preceding with relative to the latch timing of the FF 102 by t3, the output Sig105 from the FF 105 can be substantially considered as the output Sig103 from the FF 102 when it is operated in a cycle corresponding to (T−t3). Thus, an arithmetic result in a case where the FF 102 is operating at a operation frequency of 1/(T−t3) can be obtained by monitoring the output signal Sig105 in a case where the FF 102 is operating at a high-speed operation frequency of 1/T. This indicates that the operation verification at high speeds can be performed without the normal operation circuit being driven at high speeds, and accordingly the high-speed operation can be verified in a low-speed operation. This further indicates that the high-speed operation verification can be performed at the time of real operation.

Hereinafter, a method for judging the operation verification will be described with reference to FIGS. 2(a) and 2(b), as for a case 1 where there is an operation margin (a case where the data Sig100 that is latched in accordance with the clock Sig104 is determined) and a case 2 where there is no operation margin (a case where the data Sig100 that is latched in accordance with the clock Sig104 is being transited).

Case 1: When There is an Operation Margin (FIG. 2(a))

The output Sig103 from the FF 102 and the output Sig105 from the FF 105 which are stored in accordance with the clock Sig102 and the clock Sig104, and the comparison result Sig106 when there is an operation margin are shown in FIG. 2(a). When a stability judgement A of the Sig106 is monitored, a value "0" indicating matching is always ensured, thereby confirming that this circuit operates even at the operation frequency of 1/(T−t3).

Case 2: When There is No Operation Margin (FIG. 2(b)) The output Sig103 from the FF 102 and the output Sig105 from the FF 105 which are stored in accordance with the clock Sig102 and the clock Sig104, and the comparison result Sig106 when there is no operation margin are shown in FIG. 2(b). When a stability judgement B of the Sig106 is monitored, the judgement result Sig106 is undefined because the value of the Sig100 is not determined, and then it is found that the circuit does not operate stably at the operation frequency of 1/(T−t3).

The above-mentioned operation verification system according to the first embodiment includes the normal operation circuit 104 including the FF 102 as the operation verification target; and the operation verification circuit 107 including the FF 105, then stores the same data in the FF 102 and the FF 105 in accordance with clocks having different phases, and judges on the basis of output results from the FF 102 and the FF 105 whether the normal operation circuit 104 is operating stably or not. While it has conventionally been difficult to verify the high-speed operation because the operation frequency is set higher, this verification system can implement the high-speed operation verification at a lower frequency. Further, the judgement as to whether the normal operation circuit 104 is operating stably or not is performed intermittently, so that real-time verification on the real device mounted thereon can be performed.

Further, as the stable operation of the normal operation circuit can be verified at the mounting of the real device, the verification of the operation under peripheral environments surrounding the semiconductor integrated circuit at the mounting of the real device, such as the peripheral temperature or operation voltage can be performed intermittently. Further, the internal operation is stabilized and the full power of the real circuit can be unleashed by controlling the peripheral environments.

In this operation verification system according to the first embodiment, to simplify the explanation, the description has been given of the case where the verification of the high-speed operation is performed taking one FF as the verification target. However, two or more FFs which are expected to be temporally critical as a result of the delay simulation in which capacitor and resistor components are reflected at the stage of semiconductor integrated circuit design, may be taken as verification targets. When plural FFs are taken as verification targets, the operation verification circuit 107 is provided adaptively to each of the plural FFs as the verification targets, to perform the verification of high-speed operations for all of the FFs to be verified, thereby implementing the above-mentioned operation verification system.

As a means for generating the clocks having different phases, a circuit having phase information such as a ring oscillator may be provided in the clock generation unit 101, thereby extracting clocks having different phases from the circuit.

Further, as a method for generating the clocks having different phases, a method by which a delay element is inserted for making the signal Sig102 or Sig104 have a phase difference, a method by which a delay amount that is generated by routing lines on a semiconductor integrated circuit layout is employed to make the signal Sig102 or Sig104 have a phase difference, or a method by which clocks having different phases are generated outside to be supplied to the semiconductor integrated circuit may be employed to generate the clocks having different phases.

Further, as the operation clock in the arithmetic circuit group 103, not only the clock Sig101 but also clocks of plural systems may be employed. Also in this case, the same effects as described above are obtained.

Further, the judgement of the Sig106 may be performed by using exclusive OR in the semiconductor integrated circuit. Or, the Sig106 may be outputted outside the semiconductor integrated circuit, to perform the judgement by an external judgement circuit.

Further, the same effects can be obtained even in a case where the operation clock generation unit 101 is placed outside the semiconductor integrated circuit.

[Embodiment 2]

Figure 3:
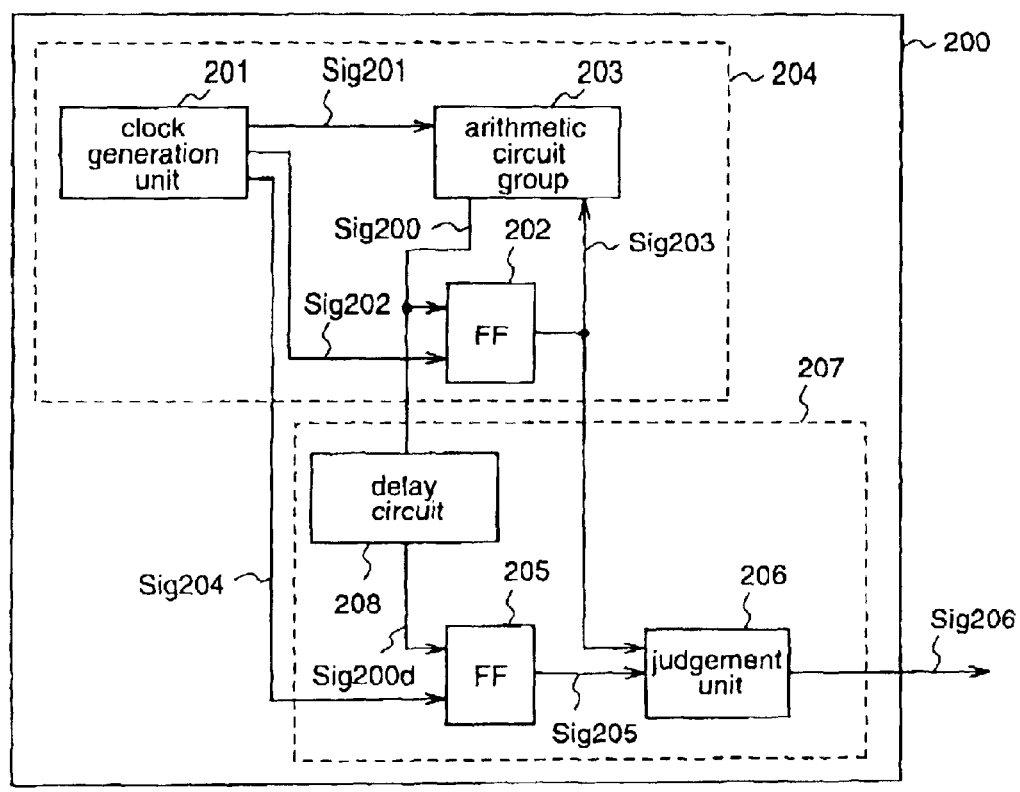
FIG. 3 is a block diagram illustrating a construction of an operation verification system according to a second embodiment of the present invention.

FIG. 3 is a block diagram illustrating a construction of an operation verification system according to a second embodiment of the present invention.

In FIG. 3, this operation verification system 200 is constituted by a normal operation circuit 204 for implementing an original function of a semiconductor integrated circuit, and an operation verification circuit 207 for verifying whether a flipflop (hereinafter, abbreviated to FF) 202 that is an inspection target is operating stably or not.

The normal operation circuit 204 is constituted by a clock generation unit 201 for generating a clock for an internal operation, a FF 202 that is a first memory element as a target of the operation verification, and an arithmetic circuit group 203 which comprises arithmetic circuits other than the FF as the verification target. The operation verification circuit 207 is constituted by a delay circuit 208 for delaying output data from the arithmetic circuit group 203, which is latched by the FF 202 (the operation verification target), a FF 205 as a second memory element that stores the data delayed by the delay circuit 208 in the same timing as the FF 202, and a judgement unit 206 for judging whether the normal operation circuit 204 is operating stably or not.

Here, the FF 202 as the operation verification target may be not only a FF that is temporally critical as a result of a delay simulation in which capacitor and resistor components are reflected, but also a FF for which wiring on the design can be easily performed. A delay time generated by the delay circuit 208 is set by performing the delay simulation in which the capacitor and resistor components are reflected at the stage of the semiconductor integrated circuit design, and so as to have more critical timing than in the case of an arithmetic path having the most critical arithmetic timing in the operation circuit 204 that implements the original function of the semiconductor integrated circuit.

Next, respective signals in FIG. 3 will be described.

Sig200 is a signal outputted from the arithmetic circuit group 203, which is latched by the FF 202. Sig200d is a signal that is obtained by delaying the Sig200 by means of the delay circuit 208 so as to have the most critical arithmetic timing in the operation circuit 204. Sig200 is a clock for driving the circuits in the arithmetic circuit group 203. Sig202 is a clock for making the FF 202 perform latching. Sig203 is an output from the FF 202, and inputted to the arithmetic circuit group 203 and the judgement unit 206. Sig204 is a clock for making the FF205 perform latching, and this is a clock having the same phase as the clock Sig202. Sig205 is an output from the FF 205. Sig206 is a result of judgement as to a comparison between the output signal Sig203 from the FF 202 and the output signal Sig205 from the FF 205.

Next, an operation of the operation verification system that is constructed as described above will be described.

FIGS. 4(a) and 4(b) are timing charts for explaining operation verification judgement in the operation verification system according to the second embodiment Reference t0 denotes an arithmetic time that is required until data corresponding to the Sig200 is determined, and this arithmetic time t0 is fixed regardless of the operation frequency. Reference t1 denotes a time during which the data corresponding to the Sig200 is being determined, and the time t1 varies with the operation frequency. Reference t3 denotes a time by which the signal Sig200 is delayed by the delay circuit 208, and the time t3 is fixed regardless of the operation frequency. "T" denotes a clock cycle of the clock Sig202, and it depends on the inverse of the operation frequency. Since data latched by the FF 205 is delayed by t3 with respect to data latched in accordance with the signal Sig202, the output Sig205 from the FF 205 can be substantially considered as the output Sig203 from the FF 202 when it is operated in a cycle corresponding to (T–t3). When the output signal Sig205 is monitored while the FF 202 is operating at a high-speed operation frequency of 1/T, an arithmetic result at the time when the FF 202 is operating at an operation frequency of 1/(T–t3) is obtained. This indicates that the operation verification at the high-speed operation can be performed without the normal operation circuit 204 being driven at high speeds, and accordingly the high-speed operation verification can be performed in a low speed operation. It further shows that the high-speed operation can be verified during the operation.

Hereinafter, a method for judging the operation verification will be described with reference to FIGS. 4(a) and 4(b), as for a case 1 where there is an operation margin (a case where the data Sig200d that is latched in accordance with the clock Sig204 is determined), and a case 2 where there is no operation margin (a case where the data Sig200d that is latched in accordance with the clock Sig204 is being transited).

Case 1: When There is an Operation Margin (FIG. 4(a))

The output Sig203 from the FF 202 and the output Sig205 from the FF 205 which are stored in accordance with the clock Sig202 and the clock Sig204, and the comparison result Sig206 when there is an operation margin are shown in FIG. 4(a). As shown in this figure, the FF 205 can latch data within a stability range A, thereby determining the Sig205. When the value of the Sig206 is monitored, a value "0" indicating matching is always confirmed, thereby confirming that the circuit operates even at the operation frequency of 1/(T–t3).

Case 2: When There is No Operation Margin (FIG. 4(b))

The output Sig203 from the FF 202 and the output Sig205 from the FF 205 which are stored in accordance with the clock Sig202 and the clock Sig204, and the comparison result Sig206 when there is no operation margin are shown in FIG. 4(b). As shown in this figure, the FF 205 cannot latch data within a stability range B, so that the Sig105 is undefined. When the value of the Sig206 is monitored, the value of the Sig200 is not determined. Consequently, the judgement result Sig206 is undefined, and thus it is found that the circuit does not stably operate at the operation frequency of 1/(T–t3).

The above-mentioned operation verification system according to the second embodiment comprises the normal operation circuit 204 including the FF 202 as the operation verification target; and the operation verification circuit 207 including the delay circuit 208 and the FF 205, then the FF 205 latches data that is obtained by delaying data latched by the FF 202 by means of the delay circuit 208, and judges on the basis of output results from the FF 202 and the FF 205 whether the normal operation circuit 204 is operating stably or not. While the verification of high-speed operations has conventionally been difficult because the operation frequency should be set higher, this operation verification system can implement the high-speed operation verification at a lower frequency. Further, the judgement as to whether the normal operation circuit 204 is operating stably or not is made intermittently, thereby enabling a real-time verification on the mounted real device.

Further, as the stable operation of the normal operation circuit can be verified at the mounting of the real device, the operation verification under peripheral environments surrounding the semiconductor integrated circuit, such as the peripheral temperature or operation voltage, at the mounting of the real device can be performed intermittently, and further the internal operation can be stabilized and the full power of the real circuit can be unleashed by controlling the peripheral environments.

In this operation verification system according to the second embodiment, the description has been given of a case where the verification of the high-speed operation is performed with taking one FF as the verification target. However, when it is difficult to accurately specify a FF that is expected to be critical in timing as a result of the delay simulation in which capacitor and resistor components are reflected at the stage of the semiconductor integrated circuit design, the verification of the high-speed operation by utilizing delay of data may be performed, with taking plural FFs that are expected to be critical in timing as verification targets. The above-mentioned operation verification system can be realized by providing the operation verification circuit 207 correspondingly to each of the plural FFs as the verification targets.

In the operation verification system according to the second embodiment, the FF 202 and the FF 205 latch data in accordance with clocks having the same phases. However, like in the above-mentioned operation verification system according to the first embodiment, the FF 202 and the FF 205 may latch data in accordance with clock having different phases. In this case, in addition to the method according to the operation verification system of the second embodiment in which data is delayed to perform the high-speed operation verification, the clock is also delayed to perform the high-speed operation verification, whereby the high-speed operation verification can be implemented even when there are some restrictions in the design, like in a case where a delay circuit 208 has the need to be placed in a limited area.

As a method for delaying a signal by the delay circuit 208, a method in which a delay element is inserted to delay a signal, a method in which lines are routed on the semiconductor integrated circuit layout to generate a signal delay, or the like may be employed.

Further, as the operation clock in the arithmetic circuit group 203, not only one clock (the clock Sig201) but also clocks of plural systems can be employed. Also in this case, the same effects as described above can be obtained.

Further, the judgement as to the Sig206 may be performed inside the semiconductor integrated circuit, by using exclusive OR. It is also possible to output the Sig206 outside the semiconductor integrated circuit and perform the judgement by means of an external judgement circuit.

[Embodiment 3]

Figure 5:
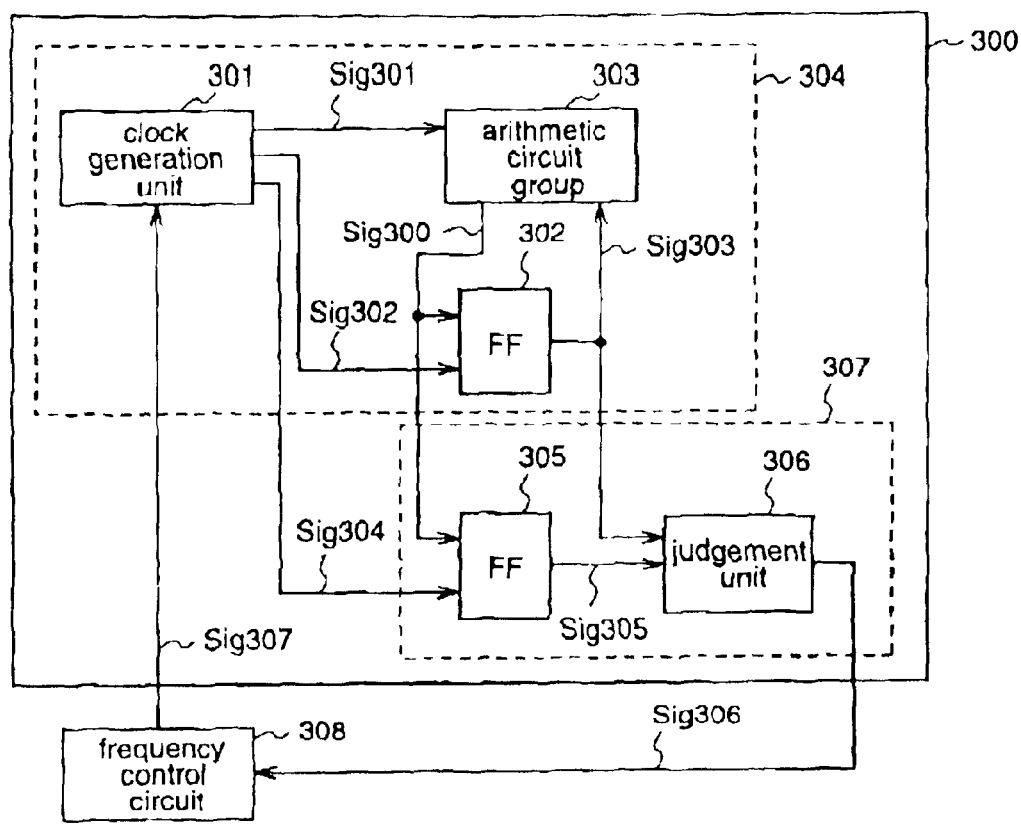
FIG. 5 is a block diagram illustrating a construction of an adaptive control system according to a third embodiment of the present invention.

FIG. 5 is a block diagram illustrating a construction of an adaptive control system according to a third embodiment of the present invention.

In FIG. 5, this adaptive control system 300 includes a normal operation circuit 304 for implementing an original function of a semiconductor integrated circuit, and an operation verification circuit 307 for verifying whether a flipflop (hereinafter, abbreviated to FF) 302 as a target of verification is stably operating or not. The adaptive control system 300 is further provided with a frequency control circuit 308 for controlling an internal operation frequency as a factor control circuit that controls factors as elements that change an internal arithmetic time in the normal operation circuit.

The normal operation circuit 304 is constituted by a clock generation unit 301 for generating a clock for an internal operation, a FF 302 as a first memory element that is a target of the operation verification, and an arithmetic circuit group 303 that comprises arithmetic circuits other than the FF 302 as the verification target. The operation verification circuit 307 is constituted by a FF 305 as a second memory element that stores data in a different timing from the FF 302, and a judgement unit 306 for judging whether the normal operation circuit 304 is stably operating or not.

Here, the FF 302 selected as the inspection target (the operation verification target) is a FF that is critical in timing as a result of a delay simulation in which capacitor and resistor components are reflected at the stage of semiconductor integrated circuit design.

Next, respective signals in FIG. 5 will be described.

Sig300 is a signal outputted from the arithmetic circuit group 303, which is latched by the FF 302 and the FF 305. Sig301 is a clock for driving the circuits in the arithmetic circuit group 303. Sig302 is a clock for making the FF 302 perform latching. Sig303 is an output from the FF 302 and inputted to the arithmetic circuit group 303 and the judgement unit 306. Sig304 is a clock for making the FF 305 perform latching, and this clock is preceding in phase with relative to the clock Sig302. Sig305 is an output from the FF 305. Sig306 is a result of judgement as to a comparison between the output signal Sig303 from the FF 302 and the output signal Sig305 from the FF 305. Sig307 is a control signal for controlling frequencies of the clocks Sig301, Sig302, and Sig304 which are outputted from the clock generation unit 301, to change an operation frequency in the normal operation circuit 304.

Next, an operation of the adaptive control system that is constructed as described above will be described with reference to FIG. 6.

Figure 6A:
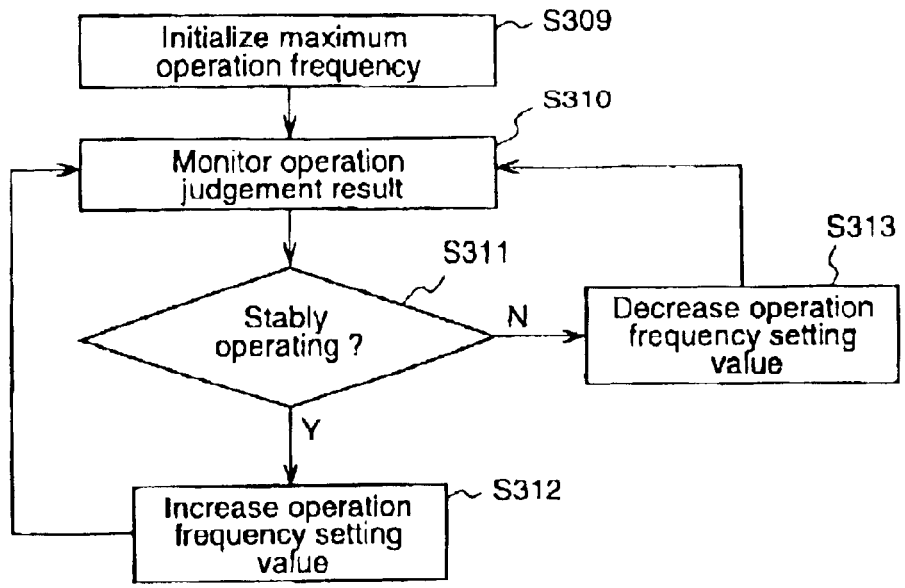
FIGS. 6(a) and 6(b) are flowcharts for explaining an operation of the adaptive control system according to the third embodiment.
Figure 6B:
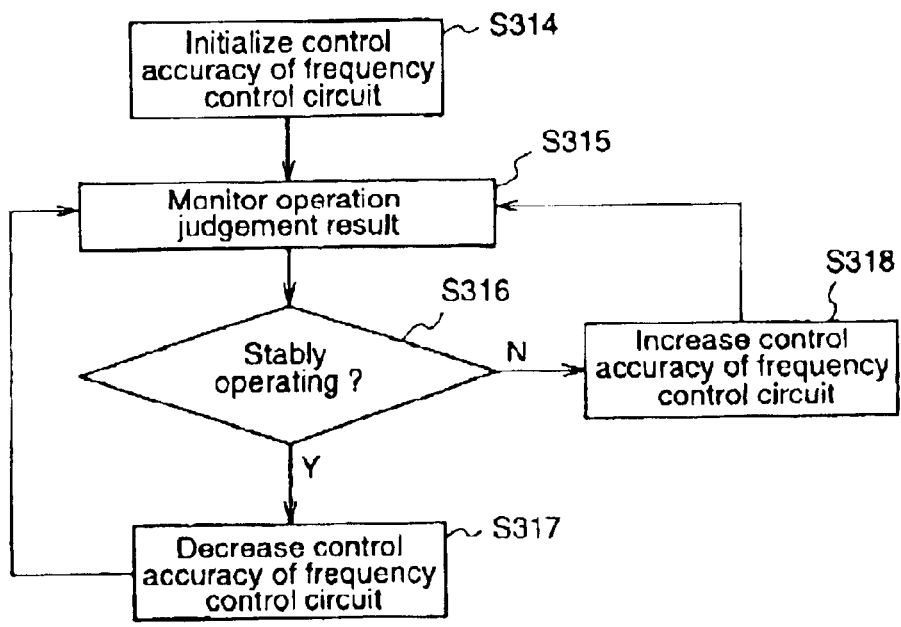

FIGS. 6(*a*) and 6(*b*) are flowcharts for explaining operations of the adaptive control system according to the third embodiment of the present invention.

FIG. 6(*a*) is a flowchart for explaining an operation of the adaptive control system for speeding up an internal operation.

Initially in step S309, an initial value of the maximum operation frequency in the frequency control circuit 308 is set at an operation frequency at which the normal operation circuit 304 normally operates. Next in step S310, the output Sig306 from the operation verification circuit 307 is intermittently monitored. Then in step S311, it is judged whether or not the normal operation circuit 304 can operate at a frequency higher than the internal operation frequency. When the circuit can operate at the higher operation frequency, the operation proceeds to step S312, in which the control signal is supplied to the clock generation unit 301 by the frequency control circuit 308 to increase the operation frequency, and then returns to step S310 to perform again the judgement as to operation margin.

When the circuit cannot operate at the higher operation frequency, the operation proceeds to step S313, in which the control signal is supplied to the clock generation unit 301 by the frequency control circuit 308 to decrease the operation frequency, and then returns to step S310 to perform again the judgement as to the operation margin.

FIG. 6(*b*) is a flowchart for explaining an operation of the adaptive control system for reducing the power consumption.

In step S314, a control accuracy of the frequency control circuit is initialized. Next in step S315, the output Sig306 from the operation verification circuit 307 is intermittently monitored and then, in step S316, a judgement as to whether the normal operation circuit can operate at a higher frequency than the internal operation frequency is performed as a criterion for an internal operation stability. When the circuit is stably operating, the operation proceeds to step S317, in which the control accuracy of the frequency control circuit is decreased, and then returns to step S315 to monitor again the operation judgement result.

In step S316, the judgement as to whether the circuit can operate at the higher frequency than the internal operation frequency is performed as the criterion for the internal operation stability and, when the circuit is not operating stably, the operation proceeds to step S318. In step S318, the control accuracy of the frequency control circuit 308 is increased, and then the operation returns to step S315 to monitor again the operation judgement result.

The above-mentioned adaptive control system according to the third embodiment is an adaptive control system having an operation verification system that includes the normal operation circuit 304 and the operation verification circuit 307, and is further provided with the frequency control circuit 308 as a factor control circuit for controlling factors as elements that change the internal arithmetic time in the normal operation circuit. Further, the frequency control circuit 308 controls the internal operation frequency of the normal operation circuit 304. Therefore, when there is a margin in the internal operation circuit under peripheral environments surrounding the semiconductor integrated circuit at the mounting of the real device, such as the peripheral temperature or operation voltage, the internal circuit is further speeded up in real time while considering the stable operation of the internal circuit Accordingly, the arithmetic speed capacity of the circuit can be unleashed according to the situations.

Further, when the normal operation circuit is stably operating, the control accuracy of the frequency control circuit is decreased, thereby reducing the power consumption by the frequency control circuit.

In this third embodiment, the frequency control circuit 308 is provided outside the semiconductor integrated circuit. However, the frequency control circuit may be provided inside the semiconductor integrated circuit. Also in this case, the same effects as described above are obtained.

In this adaptive control system according to the third embodiment, to simplify the explanation, the description has been given of a case where the verification of high-speed operations is performed taking one FF as the verification target. However, two or more FFs that are expected to be critical in timing as a result of the delay simulation in which capacitor and resistor components are reflected at the stage of the semiconductor integrated circuit design may be taken as verification targets. When plural FFs are taken as the verification targets, the operation verification circuit 307 is provided adaptively to each of the plural FFs, and the verification of the high-speed operation is performed to all of the FFs as the verification targets, thereby implementing the above-mentioned adaptive control system.

[Embodiment 4]

Figure 7:
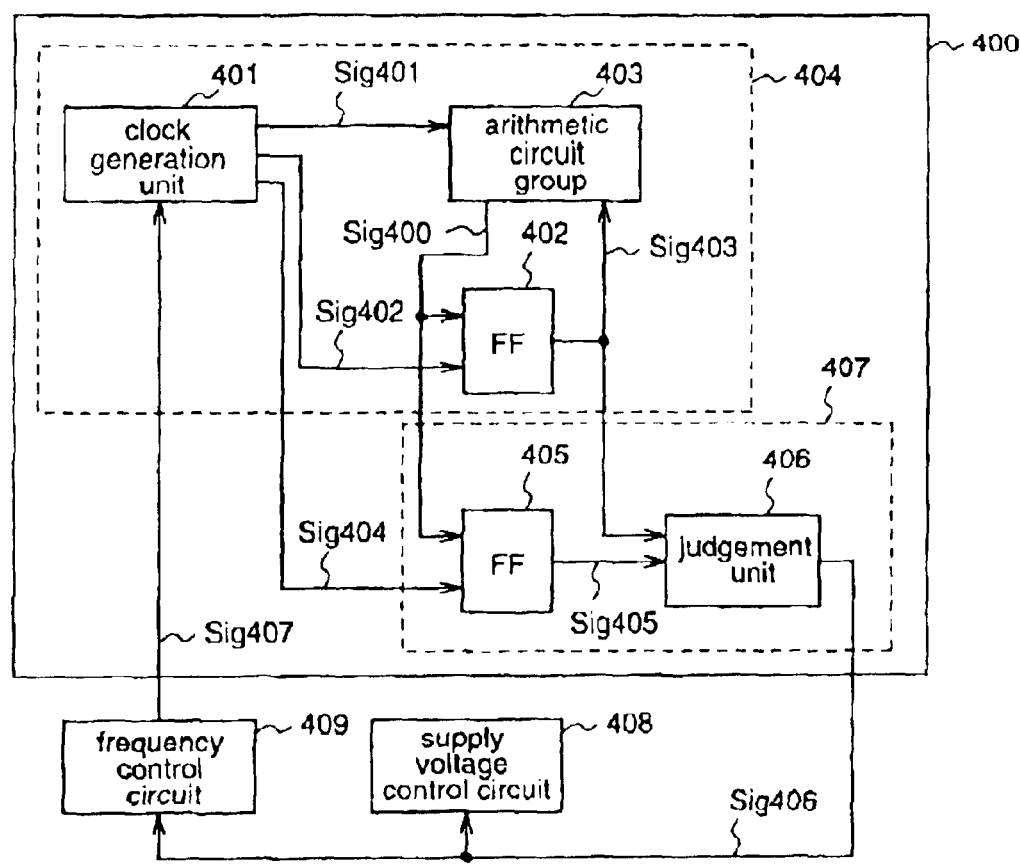
FIG. 7 is a block diagram illustrating a construction of an adaptive control system according to a fourth embodiment of the present invention.

FIG. 7 is a block diagram illustrating a construction of an adaptive control system according to a fourth embodiment of the present invention.

In FIG. 7, this adaptive control system 400 includes a normal operation circuit 404 for implementing an original function of a semiconductor integrated circuit, and an operation verification circuit 407 for verifying whether a flipflop (hereinafter, abbreviated to FF) 402 as a verification target in the normal operation circuit 404 is operating stably or not. The adaptive control system 400 is further provided with a supply voltage control circuit 408 for controlling an internal operation voltage, and a frequency control circuit 409 for controlling an internal operation frequency, as factor control circuits for controlling factors as elements that change an internal arithmetic time in the normal operation circuit.

The normal operation circuit 404 is constituted by a clock generation unit 401 for generating a clock for an internal operation, a FF 402 that is a first memory element as an operation verification target, and an arithmetic circuit group 403 which comprises arithmetic circuits other than the FF 402 as the verification target. The operation verification circuit 407 is constituted by a FF 405 as a second memory element that stores data in a different timing from the FF 402, and a judgement unit 406 for judging whether the normal operation circuit 404 is stably operating or not.

The FF 402 selected as the inspection target (the operation verification target) is a FF that is critical in timing as a result of the delay simulation in which capacitor and resistor components are reflected, at the stage of the semiconductor integrated circuit design.

Next, respective signals in FIG. 7 will be described.

Sig400 is a signal outputted from the arithmetic circuit group 403, which is latched by the FF 402 and the FF 405. Sig401 is a clock for driving the circuits in the arithmetic circuit group 403. Sig402 is a clock for making the FF 402 perform latching. Sig403 is an output from the FF 402, and inputted to the arithmetic circuit group 403 and the judgement unit 406. Sig404 is a clock for making the FF 405 perform latching, and this clock is preceding in phase with relative to the clock Sig402. Sig405 is an output from the FF 405. Sig406 is a result of judgement as to a comparison between the output signal Sig403 from the FF 402 and the output signal Sig405 from the FF 405. Sig407 is a control signal for controlling frequencies of the clocks Sig401, Sig402, and Sig404 which are outputted from the clock generation unit 401, to change the operation frequency in the normal operation circuit 404.

Hereinafter, an operation of the adaptive control system constructed as described above will be described with reference to FIGS. 8 and 9.

Figure 8:
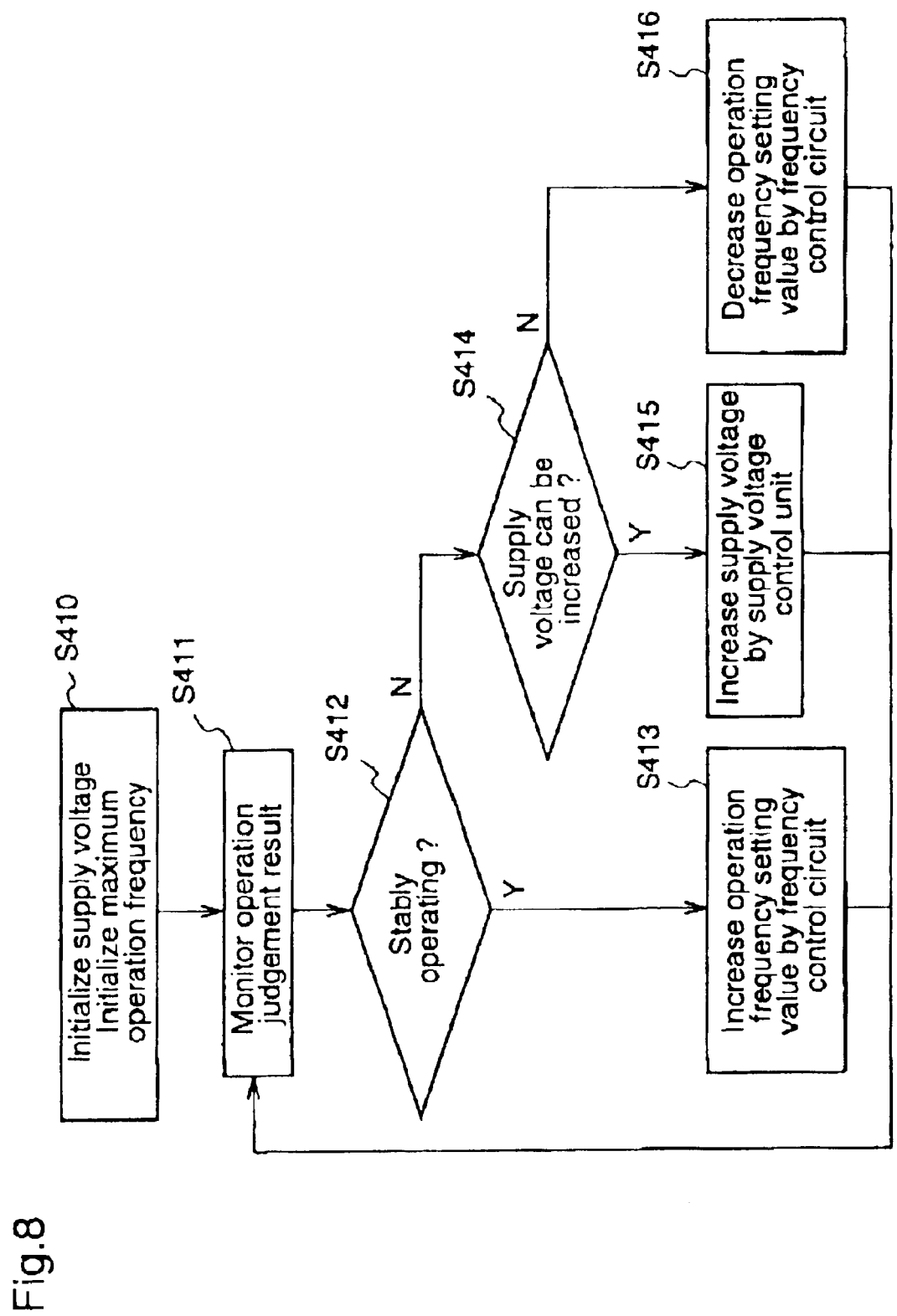
FIG. 8 is a flowchart for explaining an operation of the adaptive control system according to the fourth embodiment, relating to speeding-up of an internal operation.
Figure 9:
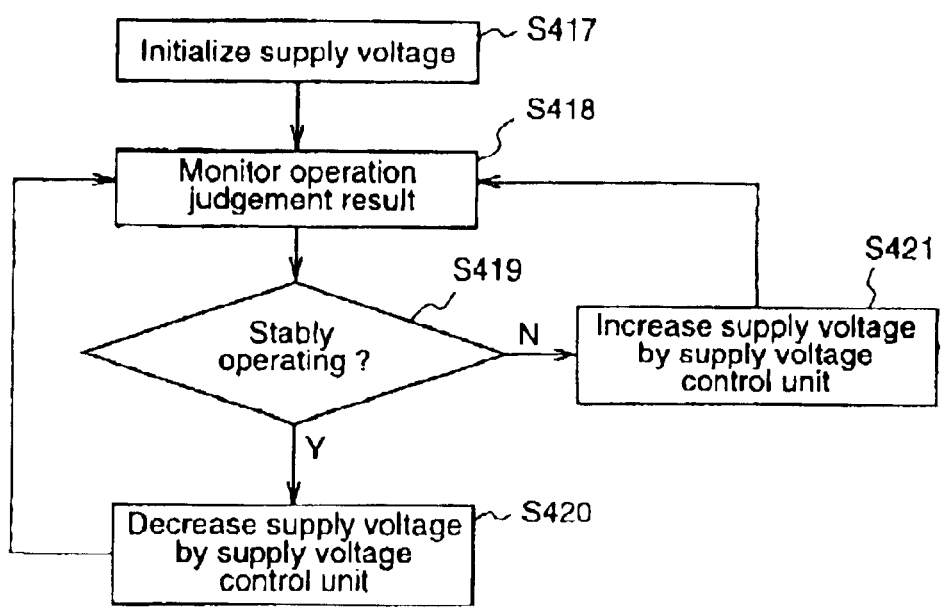
FIG. 9 is a flowchart for explaining an operation of the adaptive control system according to the fourth embodiment, relating to reduction of an internal operation voltage.

FIGS. 8 and 9 are flowcharts for explaining the operation of the adaptive control system according to the fourth embodiment.

FIG. 8 is a flowchart for explaining an operation of the adaptive control system for reducing the power consumption.

Initially in step S410, the supply voltage is initialized by the supply voltage control circuit 408 and the maximum operation frequency is initialized by the frequency control circuit 409, to be set at a supply voltage and an operation frequency at which the normal operation circuit 404 normally operates. Then in step S411, the output Sig406 from the operation verification circuit 407 is intermittently monitored and then, in step S412, it is judged whether or not the circuit can operate at a higher operation frequency than the internal operation frequency. When the circuit can operate at the higher operation frequency, the operation proceeds to step S413, in which the control signal S407 is supplied to the clock generation unit 401 by the frequency control circuit 409 to increase the operation frequency, and then returns to step S411 to perform again the judgement as to the operation margin. When the circuit cannot operate at the higher operation frequency, the operation proceeds to step S414. When the supply voltage control circuit 408 can increase the supply voltage for the adaptive control system 400, the operation proceeds to step S415, in which the supply voltage is increased to increase the internal operation speed, and thereafter returns to step S411. When the supply voltage is the upper limit and cannot be increased, the operation proceeds to step S416. Then, the control signal is supplied to the clock generation unit S401 by the frequency control circuit 409 to decrease the operation frequency, and then operation returns to step S411 to perform again the judgement as to the operation margin.

FIG. 9 is a flowchart for explaining an operation of the adaptive control system for decreasing the internal operation voltage to reduce the power consumption by the semiconductor integrated circuit.

Initially in step S417, the supply voltage is initialized by the supply voltage control circuit 408, to be set at supply voltage at which the normal operation circuit 404 normally operates. In step S418, the output Sig406 from the operation verification circuit 407 is intermittently monitored and, in step S419, it is judged whether the circuit can operate or not at a higher frequency than the internal operation frequency as a criterion for internal operation stability. When the circuit is operating stably, the operation proceeds to step S420, in which the supply voltage is decreased by the supply voltage control circuit 408, and then returns to step S418 to monitor again the result of the operation judgement. When the judgement as to whether the circuit can operate at the higher frequency than the internal operation frequency is performed as the criterion for the internal operation stability in step S419, and when the circuit is not operating stably, the operation proceeds to step S421. In step S421, the supply voltage is increased by the supply voltage control circuit 408 to increase the power of a transistor in the semiconductor integrated circuit, thereby improving an internal timing critical path, and thereafter the operation returns to step S418 to monitor again the operation judgement result.

The above-mentioned adaptive control system according to the fourth embodiment is an adaptive control system including an operation verification system that has the normal operation circuit 404 and the operation verification circuit 407, and is further provided with the frequency control circuit 409 and the supply voltage control circuit 408 as factor control circuits for controlling factors as elements that change the internal arithmetic time in the normal operation circuit. Further, the frequency control circuit 409 controls the internal operation frequency and the supply voltage control circuit 408 controls the supply voltage. Therefore, the same effects as those according to the adaptive control system of the third embodiment are obtained, as well as the internal circuit can be further speeded up in real time while considering the stable operation of the internal circuit within a range in which the supply voltage is variable, whereby the stable operation range of the normal operation circuit can be enlarged.

Further, the supply voltage is reduced within a range in which the circuit can operate normally, thereby reducing the power consumption by the semiconductor integrated circuit.

In this fourth embodiment, the frequency control circuit 409 and the supply voltage control circuit 408 are provided outside the semiconductor integrated circuit. However, the frequency control circuit and the supply voltage control circuit may be provided inside the semiconductor integrated circuit. Also in this case, the same effects as described above are obtained.

Further, in the adaptive control system according to the fourth embodiment, to simplify the explanation, the verification of the high-speed operation is performed taking one FF as the verification target. However, two or more FFs which are expected to be critical in timing as a result of the delay simulation in which capacitor and resistor components are reflected at the stage of semiconductor integrated circuit design may be taken as verification targets. When plural FFs are taken as the verification targets, the operation verification circuit 407 is provided adaptively to each of the plural FFs as the verification targets, and the verification of the high-speed operation is performed for all of the FFs as the verification targets.

[Embodiment 5]

Figure 10:
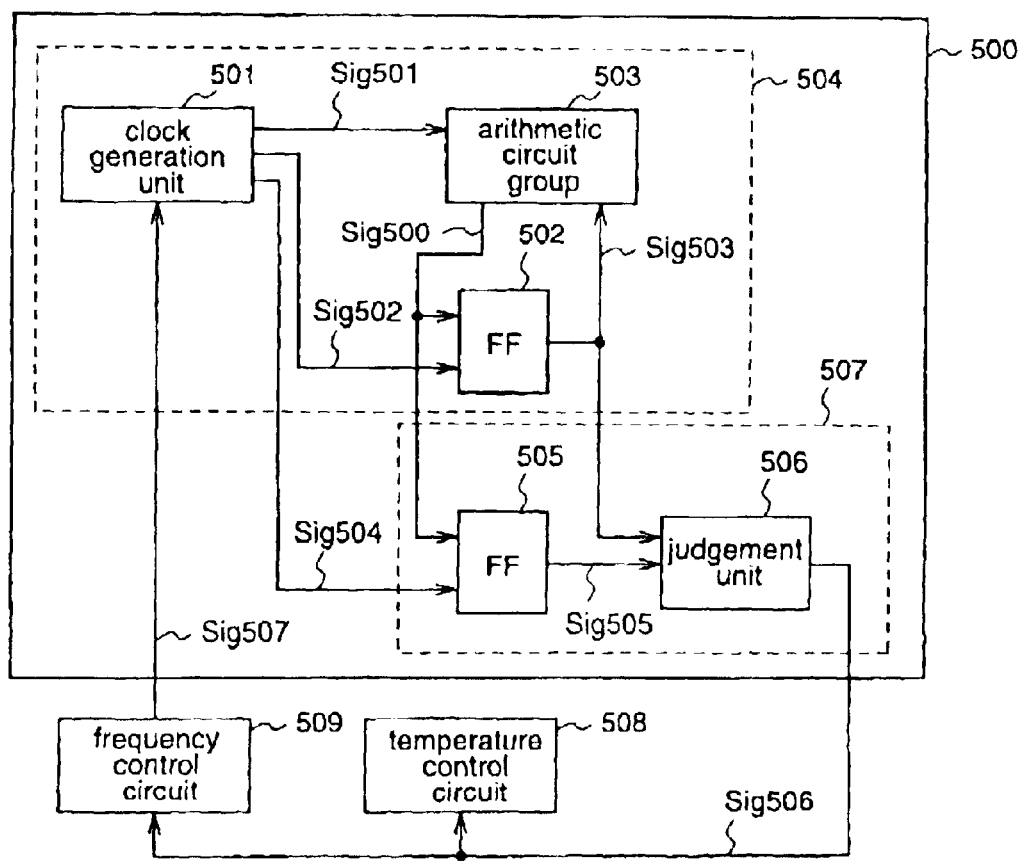
FIG. 10 is a block diagram illustrating a construction of an adaptive control system according to a fifth embodiment of the present invention.

FIG. 10 is a block diagram illustrating a construction of an adaptive control system according to a fifth embodiment of the present invention.

In FIG. 10, this adaptive control system 500 includes a normal operation circuit 504 for implementing an original function of a semiconductor integrated circuit, and an operation verification circuit 507 for verifying whether a flipflop (hereinafter, abbreviated to FF) 502 as a verification target is operating stably or not. The adaptive control system 500 is further provided with a temperature control circuit 508 for controlling an internal temperature and a frequency control circuit 509 for controlling an internal operation frequency as factor control circuits for controlling factors as elements that change an internal arithmetic time in the normal operation circuit.

The normal operation circuit 504 is constituted by a clock generation circuit 501 for generating a clock for an internal operation, a FF 502 that is a first memory element as an operation verification target, and an arithmetic circuit group 503 that comprises arithmetic circuits other than the FF 502 as the verification target. The operation verification circuit 507 is constituted by a FF 505 as a second memory element that stores data in a different timing from the FF 502, and a judgment unit 506 for judging whether the normal operation circuit 504 is operating stably or not.

The FF 502 selected as the inspection target (the operation verification target) is a FF that is critical in timing as a result of a delay simulation in which capacitor and resistor components are reflected, at the stage of semiconductor integrated circuit design.

Next, respective signals in FIG. 10 will be described.

Sig500 is a signal outputted from the arithmetic circuit group 503, which is latched by the FF 502 and the FF 505. Sig501 is a clock for driving circuits in the arithmetic circuit group 503. Sig502 is a clock for making the FF 502 perform latching. Sig503 is an output from the FF 502, and inputted to the arithmetic circuit group 503 and the judgement unit 506. Sig504 is a clock for making the FF 505 perform latching, and this clock is preceding in phase with relative to the clock Sig502. Sig505 is an output from the FF 505. Sig506 is a result of judgement as to a comparison between the output signal Sig503 from the FF 502 and the output signal Sig505 from the FF 505. Sig507 is a control signal for controlling frequencies of the clocks Sig501, Sig502, and Sig504 which are outputted from the clock generation unit 501 to change the operation frequency in the normal operation circuit 504.

Next, an operation of the adaptive control system constructed as described above will be described with reference to FIGS. 11 and 12.

Figure 11:
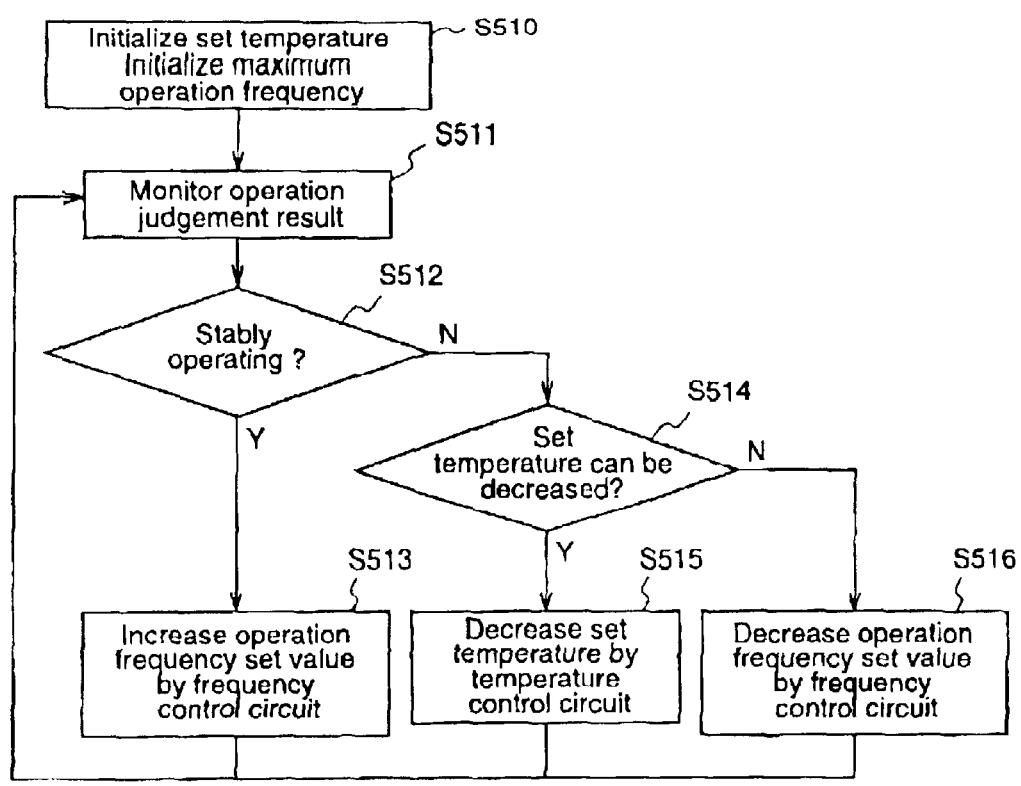
FIG. 11 is a flowchart for explaining an operation of the adaptive control system according to the fifth embodiment, relating to speeding-up of an internal operation.
Figure 12:
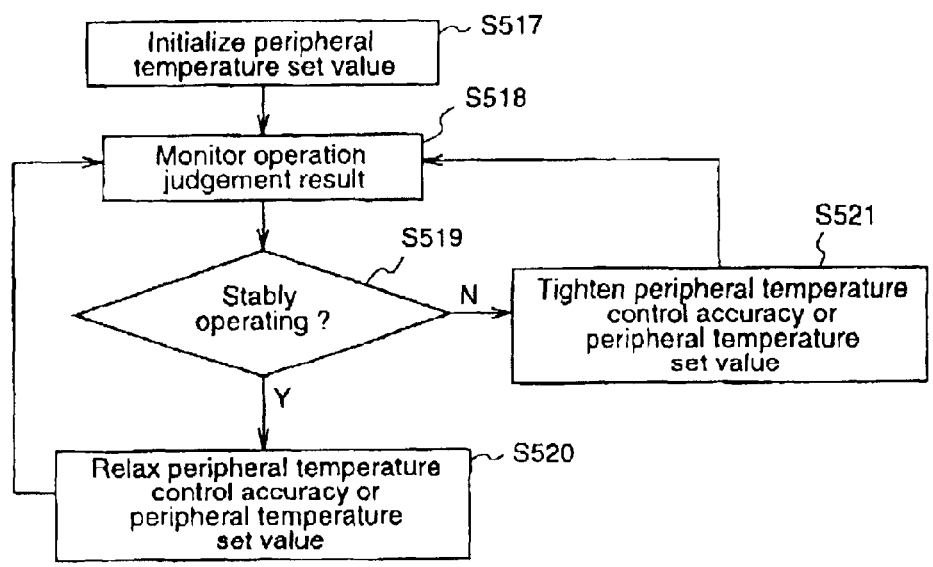
FIG. 12 is a flowchart for explaining an operation of the adaptive control system according to the fifth embodiment; relating to temperature control.

FIGS. 11 and 12 are flowcharts for explaining operations of the adaptive control system according to the fifth embodiment.

FIG. 11 is a flowchart for explaining an operation of the adaptive control system for speeding up the internal operation.

Initially in step S510, a peripheral temperature set value is initialized by the temperature control circuit 508 and the maximum operation frequency is initialized by the frequency control circuit 509, to be set at a peripheral temperature and an operation frequency at which the normal operation circuit 504 normally operates. Next in step S511, the output Sig506 from the operation verification circuit 507 is intermittently monitored and, in step S512, it is judged whether the circuit can operation at a higher frequency than the internal operation frequency. When the circuit can operate at the higher frequency, the operation proceeds to step S513, in which the control signal is supplied to the clock generation unit 501 by the frequency control circuit 509 to increase the operation frequency, and then returns to step S511 to perform again the judgement at to the operation margin. When the circuit cannot operate at the higher frequency, the operation proceeds to step S514. When the peripheral temperature of the adaptive control system 500 can be decreased by the temperature control circuit 508, the operation proceeds to step S515, in which the peripheral temperature is decreased to improve the internal operation speed, and then returns to step S511. When the peripheral temperature setting has a limit value and the peripheral temperature cannot be decreased more, the operation proceed to step S516, in which the control signal is supplied to the clock generation unit 501 by the frequency control circuit 509 to decrease the operation frequency, and then returns to step S511 to perform again the judgement as to the operation margin.

FIG. 12 is a flowchart for explaining an operation of the adaptive control system for relaxing the control accuracy or peripheral temperature set value in the temperature control circuit to reduce loads on the temperature control circuit, thereby reducing the power consumption.

Initially in step S517, the peripheral temperature set value is initialized by the temperature control circuit 508, to be set at a peripheral temperature at which the normal operation circuit 504 normally operates. Then in step S518, the output Sig506 from the operation verification circuit 507 is intermittently monitored and, in step S519, judgement as to whether the circuit can operate at a higher frequency than the internal operation frequency is performed as a criterion for internal operation stability. When the circuit is stably operating, the operation proceeds to step S520, in which the peripheral temperature control accuracy or peripheral temperature set value is relaxed by the temperature control circuit 508, and then returns to step S518 to monitor again the operation judgement result. When it is judged in step S519 whether the circuit can operate or not at the higher frequency than the internal operation frequency as the criterion for the internal operation stability, and the circuit is not operating stably, the operation proceeds to step S521, in which the peripheral temperature control accuracy or the peripheral temperature set value is changed by the temperature control circuit 508 to improve the operation environments surrounding a transistor in the semiconductor integrated circuit, and thereafter returns to step S518 to monitor again the operation judgement result.

The above-mentioned adaptive control system according to the fifth embodiment is an adaptive control system having an operation verification system that includes the normal operation circuit 504 and the operation verification circuit 507. This adaptive control system is further provided with the frequency control circuit 509 and the temperature control circuit 508 as the factor control circuits for controlling factors as elements that change the internal arithmetic time in the normal operation circuit, and the frequency control circuit 509 controls the internal the internal operation frequency and the temperature control circuit 508 controls the peripheral temperature. Therefore, the same effects as in the adaptive control system according to the third embodiment can be obtained, as well as the internal circuit can be further speeded up in real time within a range in which the peripheral temperature is variable while considering a stable operation of the internal circuit, thereby enlarging the stable operation range of the normal operation circuit.

Further, the peripheral temperature control accuracy or the peripheral temperature set value is relaxed within a range in which the circuit can stably operate, thereby reducing the power consumption by the temperature control circuit.

In this fifth embodiment, the frequency control circuit 509 and the temperature control circuit 508 are provided outside the semiconductor integrated circuit. However, the frequency control circuit and the temperature control circuit may be provided inside the semiconductor integrated circuit. Also in this case, the same effects as those described above can be obtained.

Further, in the adaptive control system according to the fifth embodiment, to simplify the explanation, the verification of a high-speed operation is performed taking one FF as the verification target. However, two or more FFs which are expected to be critical in timing as a result of the delay simulation in which capacitor and resistor components are reflected at the stage of the semiconductor integrated circuit design may be taken as verification targets. When plural FFs are subjected to the verification, the operation verification circuit 507 is provided correspondingly to each of the plural FFs as the verification targets, and the verification of the high-speed operation is performed for all of the FFs as the verification targets, thereby implementing the above-mentioned adaptive control system.

In the third, fourth, and fifth embodiments, the adaptive control system is constituted by using the operation verification system according to the first embodiment. However, the adaptive control system may be constituted by using the operation verification system according to the second embodiment, in which the FF in the operation verification circuit latches data that is obtained by delaying data to be latched by the FF as the verification target, in accordance with a clock having the same phase, or the operation verification system described as a variation of the second embodiment, in which the FF in the operation verification circuit latches data that is obtained by delaying data to be latched by the FF as the verification target, in accordance with a clock having a different phase. Also in these cases, the same effects as obtained by the adaptive control system according to the third, fourth, or fifth embodiment can be obtained.

What is claimed is:

1. An operation verification system including:
   a normal operation circuit that is constituted by a clock generation unit for generating a clock for an internal operation, a first memory element as a target of operation verification, and an arithmetic circuit group which comprises arithmetic circuits other than the first memory element;
   an operation verification circuit that is constituted by a second memory element that stores same data which is stored in the first memory element, in accordance with a clock having a different phase from that of the first memory element, and a judgement unit for judging whether the normal operation circuit is operating stably or not on the basis of results outputted from the first and second memory elements,
   said operation verification system monitoring an output from the judgement unit, to perform verification of a high-speed operation of the first memory element, at a low operation frequency.

2. The operation verification system according to claim 1 wherein
   a ring oscillator is provided in the clock generation unit, and
   the clock having the different phase is generated on the basis of phase information of the ring oscillator.

3. The operation verification system of claim 1 wherein the clock having the different phase is generated using a delay element.

4. The operation verification system of claim 1 wherein the clock having the different phase is generated using a wiring delay in a semiconductor integrated circuit.

5. The operation verification system of claim 1 wherein the clock having the different phase is generated externally and supplied to a semiconductor integrated circuit.

6. The operation verification system of claim 1 wherein the clock generation unit is provided outside a semiconductor.

7. An operation verification system including:
   a normal operation circuit that is constituted by a clock generation unit for generating a clock for an internal operation, a first memory element as a target of operation verification, and an arithmetic circuit group which comprises arithmetic circuits other than the first memory element; and an operation verification circuit that is constituted by a delay circuit for delaying data outputted from the arithmetic circuit group, which is to be latched by the first memory element, a second memory element that stores data delayed by the delay circuit, in accordance with a clock having a same phase as that of the first memory element, and a judgement unit for judging whether the normal operation circuit is operating stably or not on the basis of results outputted from the first and second memory said operation verification system monitoring an output from the judgement unit, to perform verification of a high-speed operation of the first memory element, at a low operation frequency.

8. The operation verification system of claim 7 wherein the delay circuit delays the data outputted from the arithmetic circuit group, which is latched by the first memory element, by using a delay element.

9. The operation verification system of claim 7 wherein the delay circuit delays the data outputted from the arithmetic circuit group, which is latched by the first memory element, by using a wiring delay.

10. An operation verification system including:

a normal, operation circuit that is constituted by a clock generation unit for generating a clock for an internal operation, a first memory element as a target of operation verification, and an arithmetic circuit group which comprises arithmetic circuits other than the first memory element; and an operation verification circuit that is constituted by a delay circuit for delaying data outputted from the arithmetic circuit group, which is to be latched by the first memory element, a second memory element that stores data delayed by the delay circuit, in accordance with a clock having a different phase from that of the first memory element, and a judgement unit for judging whether the normal operation circuit is operating stably or not on the basis of results outputted from the first and second memory elements, said operation verification system monitoring an output from the judgement unit, to perform verification of a high-speed operation of the first memory element, at a low operation frequency.

11. An adaptive control system having the operation verification system of claim 1, including:

a factor control circuit fez controlling a factor as an element that changes an internal arithmetic time in the normal operation circuit, on the basis of the output from the judgement unit, wherein the output of the judgement unit is monitored to perform the verification of a high-speed operation of the first memory element at a low operation frequency, while feeding back a result of the verification to the factor control circuit to control the factor within a range in which the factor can be controlled, thereby to reduce the internal arithmetic time as well as enlarge a range in which the normal operation circuit is nudged to be able to operate stably on the basis of the result outputted from the judgement unit.

12. The adaptive control system of claim 11 wherein a frequency control circuit for controlling an internal operation frequency of: the normal operation circuit is provided as the factor control circuit, and the frequency control circuit sets a higher internal operation frequency within the range in which the normal operation circuit is judged to be able to operate stably on the basis of the result outputted from the judgement unit.

13. The adaptive control system of claim 11 wherein a frequency control circuit for controlling an internal operation frequency of the normal operation circuit, and a supply voltage control circuit for controlling an internal operation voltage of the normal operation circuit, are provided as the factor control circuit, the frequency control circuit sets a higher internal operation frequency within the range in which the normal operation circuit is judged to be able to operate stably on the basis of the output result from the judgement unit, and the supply voltage control circuit controls the internal operation voltage within the range in which the normal operation circuit is judged to be able to operate stably on the basis of the output result from the judgement unit.

14. The adaptive control system of claim 11 wherein a frequency control circuit for controlling an internal operation frequency of the normal operation circuit, and a temperature control circuit for controlling an internal temperature of the normal operation circuit are provided as the factor control circuit, the frequency control circuit sets a higher internal operation frequency within the range in which the normal operation circuit is judged to be able to operate stably on the basis of the output result from the judgement unit, and the temperature control circuit controls the internal temperature within the range in which the normal operation circuit is judged to be able to operate stably an the basis of the output result from the judgement unit.

15. An adaptive control system having the operation verification system of claim 1, including:

a factor control circuit for controlling a factor as an element that changes an internal arithmetic time in the normal operation circuit on the basis of a result outputted from the judgement unit, wherein the factor control circuit performs control for reducing a power consumption by the adaptive control system within a range in which the normal operation circuit is judged to be able to operate stably on the basis of the output result from the judgement unit.

16. The adaptive control system of claim 15 wherein a frequency control circuit for controlling an internal operation frequency in the normal operation circuit is provided as the factor control circuit, and the frequency control circuit relaxes a control accuracy of the frequency control within the range in which the normal operation circuit is judged to be able to operate stably on the basis of the output result from the judgement unit, to reduce power consumption by the frequency control circuit.

17. The adaptive control system of claim 15 wherein a frequency control circuit for controlling an internal operation frequency of the normal operation circuit, and a supply voltage control circuit for controlling an internal operation voltage of the normal operation circuit are provided as the factor control circuit, the frequency control circuit relaxes a control accuracy of the frequency control within the range in which the normal operation circuit is judged to be able to operate stably on the basis of the output result from the judgement unit, to reduce power consumption by the frequency control circuit, and the supply voltage control circuit decreases the internal operation voltage within the range in which the normal operation circuit is judged to be able to operate stably on the basis of the output result from the judgement unit, to reduce power consumption by the normal operation circuit.

18. The adaptive control system of claim 15 including:

a frequency control circuit for controlling an internal operation frequency of the normal operation circuit and a temperature control circuit for controlling an internal temperature of the normal operation circuit are provided as the factor control circuit, wherein the frequency control circuit relaxes a control accuracy of frequency control within the range in which the normal operation is judged to be able to operate stably on the basis at the output result from the judgement unit, to reduce power consumption by the frequency control, circuit, and the temperature control circuit decrease a set temperature in temperature control or relaxes a control accuracy in the temperature control within the range in which the normal operation circuit is judged to be able to operate stably on the basis of the output result from the judgement unit, to reduce power consumption by the temperature control circuit.

19. An adaptive control system having the operation verification system of claim 7, including:

a factor control circuit for controlling a factor as an element that changes an internal arithmetic time in the normal operation circuit, on the basis of the output from the judgement unit, wherein the output of the judgement unit is monitored to perform the verification of a high-speed operation of the first memory element at a low operation frequency, while feeding back a result of the verification to the factor control circuit to control the factor within a range in which the factor can be controlled, thereby to reduce the internal arithmetic time as well as enlarge a range in which the normal operation circuit is judged to be able to operate stably on the basis of the result outputted from the judgement unit.

20. An adaptive control system having the operation verification system of claim 10, including:

a factor control circuit for controlling a factor as an element that changes an internal arithmetic time in the normal operation circuit, on the basis of the output from the judgement unit, wherein the output of the judgement unit is monitored to perform the verification of a high-speed operation of the first memory element at a low operation frequency, while feeding back a result of the verification to the factor control circuit to control the factor within a range in which the factor can be controlled, thereby to reduce the internal arithmetic time as well as enlarge a range in which the normal operation circuit is judged to be able to operate stably on the basis of the result outputted from the judgement unit.

21. An adaptive control system having the operation verification system of claim 7, including:

a factor control circuit for controlling a factor as an element that changes an internal arithmetic time in the normal operation circuit on the basis of a result outputted from the judgement unit, wherein the factor control circuit performs control for reducing a power consumption by the adaptive control system within a range in which the normal operation circuit is judged to be able to operate stably on the basis of the output result from the judgement unit.

22. An adaptive control system having the operation verification system of claim 10, including:

a factor control circuit for controlling a factor as an element that changes an internal arithmetic time in the normal operation circuit on the basis of a result outputted from the judgement unit, wherein the factor control circuit performs control for reducing a power consumption by the adaptive control system within a range in which the normal operation circuit is judged to be able to operate stably on the basis of the output result from the judgement unit.

* * * * *